United States Patent
Schinella

(10) Patent No.: US 7,020,859 B2
(45) Date of Patent: Mar. 28, 2006

(54) PROCESS SKEW RESULTS FOR INTEGRATED CIRCUITS

(75) Inventor: Richard D. Schinella, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 337 days.

(21) Appl. No.: 10/452,689

(22) Filed: Jun. 2, 2003

(65) Prior Publication Data

US 2004/0241990 A1    Dec. 2, 2004

(51) Int. Cl.
G06F 17/50     (2006.01)
G06F 9/45      (2006.01)

(52) U.S. Cl. .............................. 716/5; 716/6
(58) Field of Classification Search .............. 716/5, 716/19, 21, 6; 438/5, 14–17
See application file for complete search history.

(56) References Cited

U.S. PATENT DOCUMENTS

| | | | | |
|---|---|---|---|---|
| 5,439,764 A | * | 8/1995 | Alter et al. .................. | 430/5 |
| 6,130,173 A | * | 10/2000 | Esses .................. | 257/E21.206 |
| 6,319,737 B1 | * | 11/2001 | Putnam et al. ................ | 438/17 |
| 6,562,639 B1 | * | 5/2003 | Minvielle et al. ............. | 438/14 |
| 2003/0237064 A1 | * | 12/2003 | White et al. .................. | 716/5 |
| 2005/0090027 A1 | * | 4/2005 | Aghababazadeh et al. .... | 438/17 |

* cited by examiner

Primary Examiner—Matthew Smith
Assistant Examiner—Magid Y. Dimyan
(74) Attorney, Agent, or Firm—Luedeka, Neely & Graham

(57) ABSTRACT

A method of performing a characterization of an integrated circuit design that is customized during succeeding fabrication steps. The characterization is accomplished with respect to different levels of a processing parameter that is fixed during preceding fabrication steps. A wafer is processed through the preceding fabrication steps, including processing the wafer at at least one of the preceding fabrication steps using processing that produces the different levels of the processing parameter within different integrated circuits on the wafer. This produces a standardized characterization wafer. The standardized characterization wafer is processed through the succeeding fabrication steps using customized processing to produce a customized characterization wafer. The integrated circuits on the customized characterization wafer are tested to determine which of the different levels of the processing parameter produces integrated circuits having desired characteristics.

19 Claims, 1 Drawing Sheet

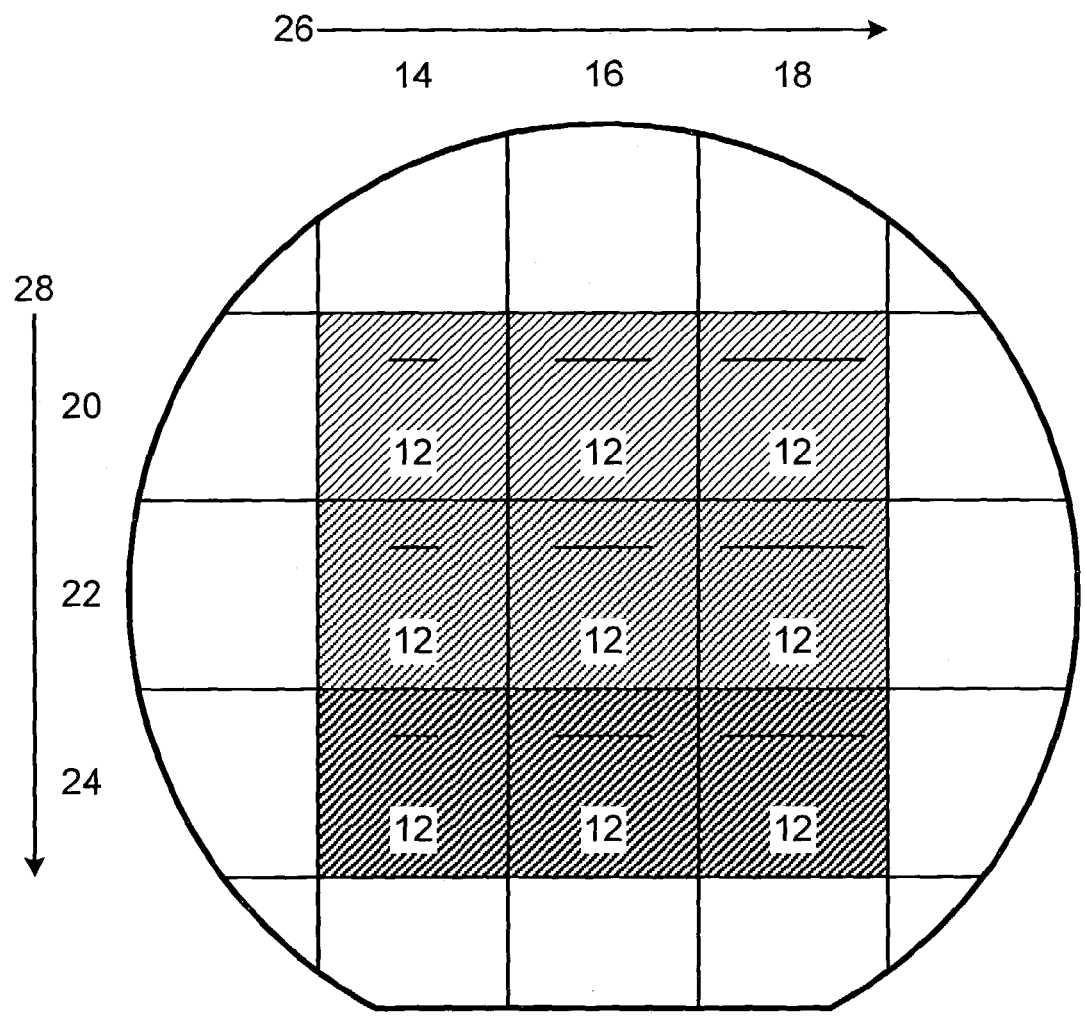

PROCESS SKEW RESULTS FOR INTEGRATED CIRCUITS

FIELD

This invention relates to the field of integrated circuit fabrication. More particularly, this invention relates to characterization of new integrated circuit designs.

BACKGROUND

The electrical performance of an integrated circuit is influenced by several different parameters. Included in this parameter set for a metal-oxide-semiconductor device are effective gate length, gate dielectric thickness, and channel doping. Integrated circuit designers typically expect an integrated circuit to operate optimally when it is fabricated in the center of the electrical and physical design rule specifications. Frequently, however, experience has shown that integrated circuit designs tend to work best in other portions of the operating design space, sometimes even at the limits of the intended operating design space.

One of the parameters that has a dramatic effect on device performance is drive current, which is affected by effective gate length of the metal-oxide-semiconductor transistor. Since it is known that the operation of a new integrated circuit design tends to be heavily influenced by the effective gate length, a customer may sometimes request that the design prototype integrated circuits be produced with several different gate lengths, so as to determine the optimum gate length for the new integrated circuit design.

This typically requires that several wafers be processed, where the integrated circuits on the different wafers are fabricated with different gate lengths, so as to span the breadth of the critical dimension specification for gate length. After testing the integrated circuits with different gate lengths from the various wafers, the effect of gate length on the performance of the integrated circuit can be determined. In the past, and for a standard application specific integrated circuit, this method tended to be acceptable since all prototype integrated circuits were fabricated using unpatterned silicon wafers as the starting point of processing, with the entire fabrication process conducted as a part of the initial prototype product.

However, newer application specific integrated circuit designs, such as LSI Logic Corporation's RapidChip technology, are similar to a gate array technology in that they rely on customization of the metal interconnect layers to meet customers' complex design requirements. Thus, a new design of such an application specific integrated circuit starts with a base wafer having complex cells, memory arrays, and gate arrays that were previously characterized. This technology is called cell-based array, and provides dramatic benefits, including the sharing of at least the design and tooling cost for the fabrication of the base wafers up to the point of customer design customization, in that many customers can use the same base wafer design as a starting platform from which to design their customized products. This results in lower costs for design and manufacturing of customized product designs, and provides customers with more affordable solutions as mask costs continue to increase. This technology also enables the customized integrated circuit designs to be fabricated with a shorter lead time, since the customized integrated circuit design is created from the point where customized metallization begins.

For products such as gate array designs, cell-based array designs, and other designs that are configured relatively late in the fabrication process, performing critical dimension skews, such as on gate length, in the normal manner as described above would actually tend to result in both a longer lead time for completion of the customized design and a higher overall cost, since an increased number of masking layers would actually be required to complete the wafers, as compared to the baseline preprocessed wafers described above. As a point of fact, the metal-oxide-semiconductor transistor gate patterning step is performed very early in the fabrication process, so most of the benefits of speed and cost as described above would be lost by employing the conventional approaches described above to provide customized integrated circuits with different gate lengths that are distributed across the process design specification.

What is needed, therefore, is a system by which process skews can be created and evaluated without losing most of the cost and time savings benefits of the baseline preprocessed application specific integrated circuit technologies.

SUMMARY

The above and other needs are met by a method of performing a characterization of an integrated circuit design that is customized during succeeding fabrication steps. The characterization is accomplished with respect to different levels of a processing parameter that is fixed during preceding fabrication steps. A wafer is processed through the preceding fabrication steps, including processing the wafer at at least one of the preceding fabrication steps using processing that produces the different levels of the processing parameter within different integrated circuits on the wafer. This produces a standardized characterization wafer. The standardized characterization wafer is processed through the succeeding fabrication steps, preferably using customized RapidChip design (or other customized metallization pattern design) processing to produce a customized design with desired performance skews on a single characterization wafer. The integrated circuits on the customized characterization wafer are tested to determine which of the different levels of the processing parameter produces integrated circuits having most optimum characteristics.

In this manner, stockpiles of standardized characterization wafers can be produced, which have different levels of a processing parameter on a single wafer. These standardized characterization wafers can then be used during the subsequent customized processing steps according to the integrated circuit design that is to be characterized. Because there are different levels of the processing parameter on each standardized characterization wafer, and because different integrated circuit designs can all use the same standardized characterization wafer, the present method reduces the amount of time required to characterize the new integrated circuit design because a substantial amount of process skewing has already been accomplished in the standardized characterization wafer. Further, the present method also reduces the cost of characterizing the new integrated circuit because the design and tooling costs associated with the standardized characterization wafer can be spread across many different development projects.

In various preferred embodiments, the different levels of the processing parameter are different gate lengths, and the processing parameter is preferably effective gate length. Preferably, the integrated circuits include metal-oxide-semiconductor transistors. The preceding fabrication steps preferably include standard CMOS processing steps up to but not including metal interconnect fabrication, and the succeeding fabrication steps preferably include metal interconnect fabrication through completion of standard CMOS processing. Preferably, the integrated circuit design is customized during a metal interconnect fabrication process included in the succeeding fabrication steps. The different levels of the processing parameter are preferably produced either with a mask that includes different levels of the processing parameter, or with a mask that is stepped across the wafer with different processing conditions. In one embodiment the different levels of the processing parameter are produced with a mask that is stepped across the wafer with different exposure energies.

Reference to metal-oxide-semiconductor devices as made herein are to be construed in their broadest context. For example, the metal can be one of many different metals or alloys of different metals, and can include polycrystalline silicon or silicon germanium mixtures that have been appropriately doped to obtain desired electrical characteristics. The metal can also be comprised of metal compounds such as metal silicides (such as PtSi, CoSi, and TiSi) or nitrides (such as TiN and TaN). The oxide need not be restricted to silicon dioxide, but can represent other materials that provide the desired electrical characteristics (bandgap, work function, dielectric strength, dielectric constant, etc) including hafnium oxides, zirconium oxides, hafnium silicates, etc. that may or may not have been doped with other materials (such as nitrogen, argon, metals, etc). The oxide represents an insulator that provides the desired electrical performance.

In one embodiment the processing parameter is a first processing parameter and a second processing parameter. The first processing parameter is varied at different levels across the wafer in a first direction and the second processing parameter is varied at different levels across the wafer in a second direction. An array of different combinations of the first processing parameter and the second processing parameter is thereby produced across the wafer.

According to another aspect of the invention there is described a method of performing a characterization of an integrated circuit design that is customized during succeeding fabrication steps. The characterization is accomplished with respect to different lengths of an effective gate length that is fixed during preceding fabrication steps. A wafer is processed through the preceding fabrication steps, including processing the wafer at at least one of the preceding fabrication steps using processing that produces the different lengths of the effective gate length within different integrated circuits on the wafer. This produces a standardized characterization wafer. The standardized characterization wafer is processed through the succeeding fabrication steps using customized processing to produce a customized characterization wafer. The integrated circuits on the customized characterization wafer are tested to determine which of the different lengths of the effective gate length produces integrated circuits having desired characteristics.

In various preferred embodiments, the preceding fabrication steps include standard CMOS processing steps up to but not including metal interconnect fabrication. The different lengths of the effective gate length are alternately produced such as with a mask that includes different gate lengths, or with a mask that is stepped across the wafer with different exposure energies, or with a combination of these and other techniques.

In one embodiment, the wafer is processed at at least one of the preceding fabrication steps using processing that produces different ion implantation profiles within different integrated circuits on the wafer, producing the standardized characterization wafer. The effective gate length is varied at different lengths across the wafer in a first direction and the different ion implantation profiles are varied across the wafer in a second direction. This produces an array across the wafer of different combinations of the effective gate length and the ion implantation profiles. Testing of the integrated circuits on the customized characterization wafer further determines which combination of the different lengths of the effective gate length and the different ion implantation profiles produces integrated circuits having desired characteristics.

According to yet another aspect of the invention there is described a standardized characterization wafer adapted to perform a characterization of an integrated circuit design that is customized during succeeding fabrication steps. The characterization is accomplished with respect to different levels of a processing parameter that is fixed during preceding fabrication steps. The standardized characterization wafer has integrated circuit structures formed through the preceding fabrication steps, including different levels of the processing parameter within different ones of the integrated circuits.

In various preferred embodiments, the different levels of the processing parameter are different gate lengths. Preferably the processing parameter is a first processing parameter and a second processing parameter, where the first processing parameter is varied at different levels across the wafer in a first direction and the second processing parameter is varied at different levels across the wafer in a second direction. In this manner an array of different combinations of the first processing parameter and the second processing parameter are produced across the wafer. The preceding fabrication steps preferably include standard CMOS processing steps up to but not including metal interconnect fabrication.

BRIEF DESCRIPTION OF THE DRAWINGS

Further advantages of the invention are apparent by reference to the detailed description when considered in conjunction with the FIGURE, which is not to scale so as to more clearly show the details, and which depicts a top plan view of a wafer including integrated circuits.

DETAILED DESCRIPTION

With reference now to the FIGURE, there is depicted a top plan view of a wafer 10 including nine integrated circuits 12. It is appreciated that the wafer 10 in actual implementation would typically include a far greater number of integrated circuits 12 than the nine depicted in the FIGURE. However, the number of integrated circuits 12 so depicted is sufficient for describing the various aspects of the present invention, without unduly burdening the FIGURE with unnecessary and potentially distracting detail.

The integrated circuits 12 as depicted are graded with one of three different levels of two different characteristics, which represent different levels of processing parameters, such as gate length and ion implantation profile. The different levels of gate lengths are represented by the three different lengths of the horizontal bar within each of the integrated circuits 12. As depicted, the length of the horizontal bar increases when moving in the first direction 26 across the surface of the wafer 10. Thus, the horizontal bars are the shortest in column 14 of the integrated circuits 12, representing for example the shortest gate lengths. The horizontal bars are of intermediate length in column 16 of the integrated circuits 12, representing for example an intermediate gate length. Finally, the horizontal bars are the longest in column 18 of the integrated circuits 12, representing for example the longest gate lengths.

Similarly, the different ion implantation profiles are represented by the three different cross hatch densities within each of the integrated circuits 12. As depicted, the density of the cross hatch increases when moving in the second direction 28 across the surface of the wafer 10. Thus, the cross hatches are the least dense in row 20 of the integrated circuits 12, representing for example the lightest dosage or shallowest depth of ion implantation profile. The cross hatches are of intermediate density in row 22 of the integrated circuits 12, representing for example an intermediate dosage or depth of ion implantation profile. Finally, the cross hatches are the most dense in row 24 of the integrated circuits 12, representing for example the heaviest dosage or deepest depth of ion implantation profile.

It is appreciated that the depiction of variation in the various processing parameters as described and depicted are representative only. Thus, there may be many more levels than three for each of the process parameter variations, or they may be only two. Further, only one process parameter may be varied at different levels across the surface of the wafer 10, or many process parameters may be varied at different levels across the surface of the wafer 10. In addition, the directions in which different process parameters are varied may be different from that described, and may not be smoothly graded across the surface of the wafer 10 in a single direction, as depicted. Also, the variation of process parameters may not be accomplished in differing directions, but may all be accomplished in the same direction.

However, in the preferred embodiment, the gate length is the processing parameter that is varied, and the variation of the gate length is preferably accomplished in steps as depicted across the surface of the wafer 10, where the gate length is preferably varied from a length considered to be an absolute minimum to a length that is considered to be an absolute maximum. If a second parameter is varied, then it is preferably ion implantation profile, such as at least one of dosage and depth. The ion implantation profile is preferably varied in a second direction as depicted, which second direction is most preferably orthogonal to the first direction in which the gate length is varied. The ion implantation profile is preferably varied from a profile which is considered to be the extreme limit in one direction, to a profile which is considered to be the extreme limit in the other direction, be that direction one or a combination of dosage and depth.

The different gate lengths can be formed using a variety of different methods, either individually or in combination one with another. For example, the different gate lengths can be formed in a mask having several different integrated circuit patterns on it, where the integrated circuit patterns each have a different gate length. This mask, such as a reticle, can then be stepped across the surface of the wafer 10, producing blocks or stripes of integrated circuits that each have different gate lengths. Alternately, the different gate lengths can be produced by exposing different stripes across the surface of the wafer 10 with different exposure energies as the mask is stepped along the wafer 10. As previously mentioned, a combination of these and other methods may be employed to produce the different gate lengths.

Thus, the wafer 10 is preferably processed through the fabrication steps of a standard integrated circuit process, such as a standard CMOS processing sequence, to a point just before, but not including, formation of the electrically conductive interconnects for the structures within the integrated circuits 12. The wafer 10 at that point constitutes a standardized characterization wafer. The wafer 10 is standardized because it can be used for a variety of different integrated circuit designs, which are customized through the subsequent processing of the wafer 10. The wafer 10 is also a characterization wafer, because it includes several different levels of one or more processing parameter, such as gate length or ion implantation profile, rather than just a single level of each processing parameter, as would be standard on a normal production wafer.

As mentioned elsewhere herein, these standardized characterization wafers are preferably kept in inventory, so that when a new integrated circuit design needs to be characterized, they can be customized through subsequent processing according to the new integrated circuit design. Once the wafer 10 is processed through the customized subsequent processing, it becomes a customized characterization wafer for the given integrated circuit design. The wafer 10 is customized because of the customized subsequent processing, such as the metal interconnects, and is a characterization wafer because of the various levels of the processing parameters as produced during the preceding processing.

In this manner, relatively little time is needed to take a new integrated circuit design through the subsequent processing where it can be tested, and the desired levels of the varied processing parameters can be determined. In addition, because the standardized characterization wafers can be used with many different integrated circuit designs, the costs associated with the design and tooling for the standardized characterization wafers can be distributed across many different customized integrated circuit designs, thus reducing the cost associated with characterizing the customized integrated circuit designs.

Thus, the methods and structures according to the present invention as described herein reduce the problems of longer processing times and higher costs associated with characterization of new integrated circuit designs that use gate array designs, cell-based array designs, and other designs that are configured relatively late in the fabrication process, in a manner as follows. Variable process parameters, such as gate dimensions, are printed on a single base wafer at the appropriate step, such as at the gate patterning step. Such wafers are then processed beyond this operation, preferably as a group, and held at an inventory location prior to the application of the metal interconnect customization layers One or more of the wafers from this group are completed through the metal interconnect customization operations, at a time when the customer prototype integrated circuit design is initiated. Upon completion of the testing of the various integrated circuits, the results will indicate the level of varied processing parameter, such as the critical dimension of the gate, that provides the most ideal performance characteristics. If required, production integrated circuit lots can subsequently be started from the relevant process step, such as the gate patterning operation, to provide optimum transistor gate lengths for future groups of wafers.

By adjusting gate lengths to span the dimensions of interest for all base wafer arrays, and storing these groups of wafers prior to the customization steps, significant manufacturing time and cost can be saved, while providing for design optimization in a single wafer.

Variation in the gate dimension can be obtained by a combination of one or more of several different means. Devices with different gate dimensions can be provided on a single reticle (mask) so that every time the reticle is printed, several dimensions will print at the same time on adjacent dice. Alternately, a reticle with a constant dimension for all devices in the reticle field can be printed using different exposure doses (energies) in different regions of the wafer. The different energies can be scanned, for example, as bands across the wafers.

In a similar manner, base wafers can be ion implanted using different conditions, such as energy and dose, with bands of the different implant parameters oriented in a different direction to the gate dimension variation bands. By completing wafers of this type from the onset of customization, the combined effect of varying implants and dimension can be determined from the same wafer.

The methods described above need not be restricted to MOS devices, but could be applied to the manufacture of any device where variation of certain process parameters for the purpose of device optimization needs to be done early in the device fabrication flow, and where customization of the design is done late in the process flow. While the above description has focused upon MOS device structures, the methods would apply equally as well to the manufacture of bipolar transistor integrated circuits and other novel device-type integrated circuits including junction FET transistors, Fermi-FET devices, optical devices, etc.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of performing a characterization of an integrated circuit design that is customized during succeeding fabrication steps, the characterization accomplished with respect to different levels of a processing parameter that is fixed during preceding fabrication steps, the method comprising the steps of:
    processing a wafer through the preceding fabrication steps, including processing the wafer at at least one of the preceding fabrication steps using processing that produces the different levels of the processing parameter within different integrated circuits on the wafer, to produce a standardized characterization wafer,
    processing the standardized characterization wafer through the succeeding fabrication steps using customized processing to produce a customized characterization wafer, and
    testing the integrated circuits on the customized characterization wafer to determine which of the different levels of the processing parameter produces integrated circuits having desired characteristics,
    wherein the different levels of the processing parameter are produced with a mask that is stepped across the wafer with different processing conditions.

2. The method of claim 1, wherein the different levels of the processing parameter comprise different gate lengths.

3. The method of claim 1, wherein the processing parameter comprises effective gate length.

4. The method of claim 1, wherein the integrated circuits include metal-oxide-semiconductor transistors.

5. The method of claim 1, wherein the preceding fabrication steps include standard CMOS processing steps up to but not including metal interconnect fabrication.

6. The method of claim 1, wherein the succeeding fabrication steps include metal interconnect fabrication through completion of standard CMOS processing.

7. The method of claim 1, wherein the integrated circuit design is customized during a metal interconnect fabrication process included in the succeeding fabrication steps.

8. The method of claim 1, wherein the different levels of the processing parameter are additionally produced with a mask that includes different levels of the processing parameter.
    wherein the different levels of the processing parameter are produced with a mask that is stepped across the wafer with different processing conditions.

9. A method of performing a characterization of an integrated circuit design that is customized during succeeding fabrication steps, the characterization accomplished with respect to different levels of a processing parameter that is fixed during preceding fabrication steps, the method comprising the steps of:
    processing a wafer through the preceding fabrication steps, including processing the wafer at at least one of the preceding fabrication steps using processing that produces the different levels of the processing parameter within different integrated circuits on the wafer, to produce a standardized characterization wafer,
    processing the standardized characterization wafer through the succeeding fabrication steps using customized processing to produce a customized characterization wafer, and
    testing the integrated circuits on the customized characterization wafer to determine which of the different levels of the processing parameter produces integrated circuits having desired characteristics,
    wherein the different levels of the processing parameter are produced with a mask that is stepped across the wafer with different exposure energies.

10. A method of performing a characterization of an integrated circuit design that is customized during succeeding fabrication steps, the characterization accomplished with respect to different levels of a processing parameter that is fixed during preceding fabrication steps, the method comprising the steps of:
    processing a wafer through the preceding fabrication steps, including processing the wafer at at least one of the preceding fabrication steps using processing that produces the different levels of the processing parameter within different integrated circuits on the wafer, to produce a standardized characterization wafer,
    processing the standardized characterization wafer through the succeeding fabrication steps using customized processing to produce a customized characterization wafer, and
    testing the integrated circuits on the customized characterization wafer to determine which of the different levels of the processing parameter produces integrated circuits having desired characteristics,
    wherein the processing parameter comprises a first processing parameter and a second processing parameter, where the first processing parameter is varied at different levels across the wafer in a first direction and the second processing parameter is varied at different levels across the wafer in a second direction, thereby producing an array across the wafer of different combinations of the first processing parameter and the second processing parameter.

11. A method of performing a characterization of an integrated circuit design that is customized during succeeding fabrication steps, the characterization accomplished with respect to different lengths of an effective gate length that is fixed during preceding fabrication steps, the method comprising the steps of:

processing a wafer through the preceding fabrication steps, including processing the wafer at at least one of the preceding fabrication steps using processing that produces the different lengths of the effective gate length within different integrated circuits on the wafer, to produce a standardized characterization wafer, processing the standardized characterization wafer through the succeeding fabrication steps using customized processing to produce a customized characterization wafer, and testing the integrated circuits on the customized characterization wafer to determine which of the different lengths of the effective gate length produces integrated circuits having desired characteristics, wherein the different lengths of the effective gate length are produced with a mask that includes different gate lengths.

12. The method of claim 11 wherein the preceding fabrication steps include standard CMOS processing steps up to but not including metal interconnect fabrication.

13. A method of performing a characterization of an integrated circuit design that is customized during succeeding fabrication steps, the characterization accomplished with respect to different lengths of an effective gate length that is fixed during preceding fabrication steps, the method comprising the steps of:

processing a wafer through the preceding fabrication steps, including processing the wafer at at least one of the preceding fabrication steps using processing that produces the different lengths of the effective gate length within different integrated circuits on the wafer, to produce a standardized characterization wafer, processing the standardized characterization wafer through the succeeding fabrication steps using customized processing to produce a customized characterization wafer, and testing the integrated circuits on the customized characterization wafer to determine which of the different lengths of the effective gate length produces integrated circuits having desired characteristics, wherein the different lengths of the effective gate length are produced with a mask that is stepped across the wafer with different exposure energies.

14. A method of performing a characterization of an integrated circuit design that is customized during succeeding fabrication steps, the characterization accomplished with respect to different lengths of an effective gate length that is fixed during preceding fabrication steps, the method comprising the steps of:

processing a wafer through the preceding fabrication steps, including processing the wafer at at least one of the preceding fabrication steps using processing that produces the different lengths of the effective gate length within different integrated circuits on the wafer, to produce a standardized characterization wafer, while processing the wafer through the preceding fabrication steps, processing the wafer at at least one of the preceding fabrication steps using processing that produces different ion implantation profiles within different integrated circuits on the wafer, to produce the standardized characterization wafer, where the effective gate length is varied at different lengths across the wafer in a first direction and the different ion implantation profiles are varied across the wafer in a second direction, thereby producing an array across the wafer of different combinations of the effective gate length and the ion implantation profiles, and wherein the testing of the integrated circuits on the customized characterization wafer further determine which combination of the different lengths of the effective gate length and the different ion implantation profiles produces integrated circuits having desired characteristics, processing the standardized characterization wafer through the succeeding fabrication steps using customized processing to produce a customized characterization wafer, and testing the integrated circuits on the customized characterization wafer to determine which of the different lengths of the effective gate length produces integrated circuits having desired characteristics.

15. A standardized characterization wafer adapted to perform a characterization of an integrated circuit design that is customized during succeeding fabrication steps, the characterization accomplished with respect to different levels of a processing parameter that is fixed during preceding fabrication steps, the standardized characterization wafer comprising integrated circuit structures formed through the preceding fabrication steps, including different levels of the processing parameter within different ones of the integrated circuits, wherein the processing parameter comprises a first processing parameter and a second processing parameter, where the first processing parameter is varied at different levels across the wafer in a first direction and the second processing parameter is varied at different levels across the wafer in a second direction, thereby producing an array across the wafer of different combinations of the first processing parameter and the second processing parameter.

16. The standardized characterization wafer of claim 15, wherein the different levels of the processing parameter comprise different gate lengths.

17. The standardized characterization wafer of claim 15, wherein the preceding fabrication steps include standard CMOS processing steps up to but not including metal interconnect fabrication.

18. A standardized characterization wafer adapted to perform a characterization of an integrated circuit design that is customized during succeeding fabrication steps, the characterization accomplished with respect to different levels of a processing parameter that is fixed during preceding fabrication steps, the standardized characterization wafer comprising integrated circuit structures formed through the preceding fabrication steps, including different levels of the processing parameter within different ones of the integrated circuits, wherein the different levels of the processing parameter comprise different lengths of effective gate length, and the different lengths of the effective gate length are produced with a mask that is stepped across the wafer with different exposure energies.

19. A standardized characterization wafer adapted to perform a characterization of an integrated circuit design that is customized during succeeding fabrication steps, the characterization accomplished with respect to different lev els of a processing parameter that is fixed during preceding fabrication steps, the standardized characterization wafer comprising integrated circuit structures formed through the preceding fabrication steps, including different levels of the processing parameter within different ones of the integrated circuits, wherein the different levels of the processing parameter comprise different lengths of effective gate length, and the different lengths of the effective gate length are produced with a mask that includes different gate lengths.

* * * * *